(12) United States Patent
Uto et al.

(10) Patent No.: US 6,674,328 B2
(45) Date of Patent: Jan. 6, 2004

(54) AMPLIFIER CIRCUIT

(75) Inventors: Ken-ichi Uto, Tokyo (JP); Kuniaki Motoshima, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/049,290

(22) PCT Filed: Jun. 6, 2001

(86) PCT No.: PCT/JP01/04781

§ 371 (c)(1),
(2), (4) Date: Feb. 11, 2002

(87) PCT Pub. No.: WO01/97374

PCT Pub. Date: Dec. 20, 2001

(65) Prior Publication Data

US 2002/0113652 A1 Aug. 22, 2002

(30) Foreign Application Priority Data

Jun. 12, 2000 (JP) .................................. 2000-176149

(51) Int. Cl.[7] .................................................. H03F 3/45
(52) U.S. Cl. ...................................................... 330/259
(58) Field of Search ................... 330/9, 11, 259; 327/307

(56) References Cited

U.S. PATENT DOCUMENTS 4,460,873 A * 7/1984 Hester ........................ 330/259
6,211,716 B1 * 4/2001 Nguyen et al. ............. 327/307

FOREIGN PATENT DOCUMENTS

| JP | 54-99549 | 7/1979 |
| JP | 59-183516 | 10/1984 |
| JP | 62-202635 | 9/1987 |
| JP | 8-288757 | 11/1996 |
| JP | 10-190385 | 7/1998 |
| JP | 11-4265 | 1/1999 |
| JP | 11-008522 | 1/1999 |
| JP | 11-168335 | 6/1999 |

* cited by examiner

Primary Examiner—Steven J. Mottola
(74) Attorney, Agent, or Firm—Birch, Stewart, Kolasch & Birch, LLP (57) ABSTRACT

The amplifier circuit includes differential amplifier circuits (3 to 4); a peak detector circuit (7) for detecting a peak value of an output voltage of a differential amplifier circuit 4 of the last stage; an offset compensation voltage generator circuit (8) for generating an offset compensation voltage for offset compensation on the basis of a detection result of the peak detector circuit (7); and an offset output limiter circuit (9) for limiting the offset compensation voltage generated by the offset compensation voltage generator circuit (8) into a predetermined range and feeding back the limited offset compensation voltage to a differential amplifier circuit (3) of the first stage.

7 Claims, 5 Drawing Sheets

AMPLIFIER CIRCUIT

This application is the national phase under 35 U.S.C. §371 of PCT International Application No. PCT/JP01/04781 which has an International filing date of Jun. 6, 2001, which designated the United States of America.

TECHNICAL FIELD

The present invention relates to a amplifier circuit for conducting amplification by using one or more differential amplifier circuits. Particularly this invention relates to an amplifier circuit that compensates an offset voltage caused by, for example, dispersion of transistor characteristics.

BACKGROUND ART

Amplifier circuits used in optical communication systems have multi-stage connected differential amplifier circuits in order to amplify a wide band signal ranging from low frequencies to high frequencies. These differential amplifier circuits are integrated in order to reduce the size and cost. In such integrated circuits, dispersion generating due to transistors cannot be neglected. In other words, a direct current component of a voltage input to a positive-phase input terminal of a differential amplifier circuit is deviated from a direct current component of a voltage input to an negative-phase input terminal due to variations of the temperature and power supply voltage, resulting in an offset voltage. This offset voltage is amplified by the multi-stage differential amplifier circuit, causing a duty variation between the positive-phase and the negative-phase. This causes a problem that a desired output amplitude cannot be obtained.

Figure 5:
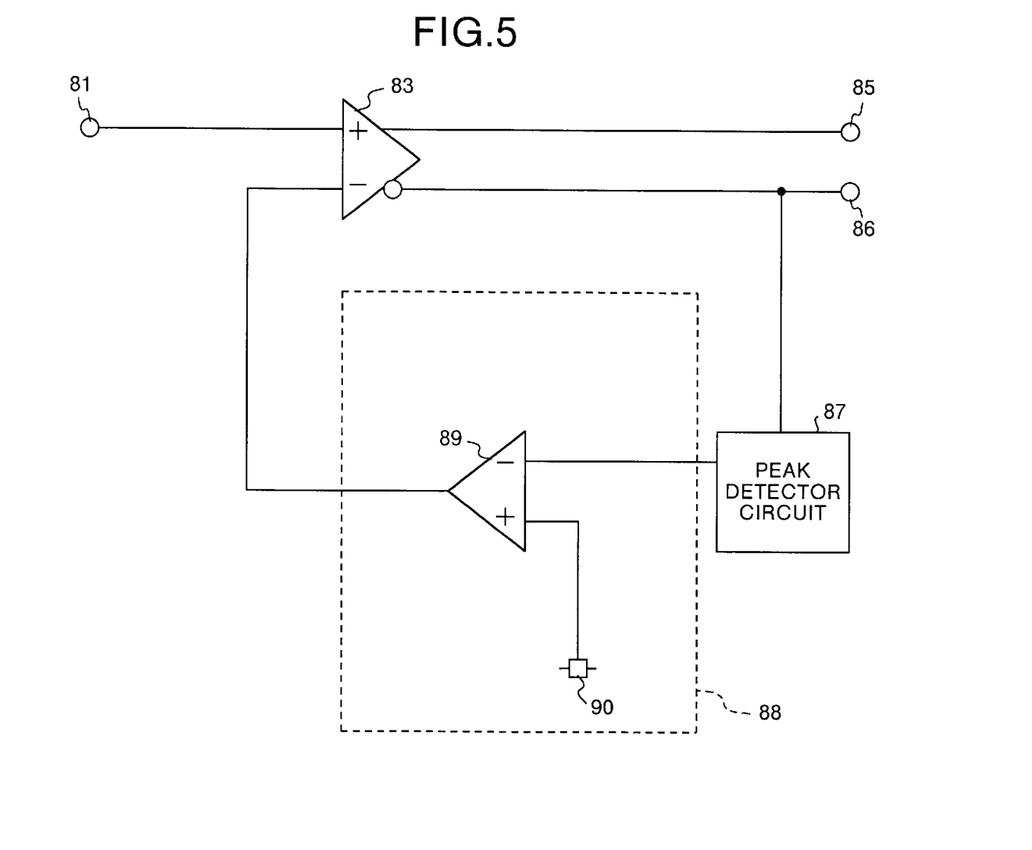
FIG. 5 is a diagram showing a configuration of a conventional amplifier circuit.

Japanese Patent Application Laid-Open No. 11-4265 discloses an amplifier that solves the above-mentioned problem. FIG. 5 is a diagram showing a configuration of this conventional amplifier. This amplifier includes a differential amplifier circuit 83, which receives an input signal fed from an input terminal 81 as a positive-phase input thereof, and which outputs a positive-phase signal and a negative-phase signal respectively to output terminals 85 and 86. Moreover, there are provided a peak detector circuit 87, which receives the negative-phase output of the differential amplifier circuit 83 as an input thereof, and a differential amplifier circuit 89, which receives an output signal of the peak detector circuit 87 as a negative-phase thereof, receives a reference voltage 90 serving as a linear operation upper limit voltage of the output signal of the differential amplifier circuit 83 as a positive-phase input thereof, and supplies an output thereof to the differential amplifier circuit 83 as its negative-phase input. The differential amplifier circuit 89 forms an offset compensation voltage generator circuit 88. The input signal supplied from the input terminal 81 is supposed to be a rectangular signal of "1"and "0."

The differential amplifier circuit 83 amplifies the input signal fed from the input terminal 81, and outputs the positive-phase signal and the negative-phase signal to the output terminals 85 and 86, respectively. The peak detector circuit 87 is supplied with the negative-phase output signal fed from the differential amplifier circuit 83. The peak detector circuit 87 detects a peak voltage of the negative-phase output signal, which corresponds to "0" of the input signal. The differential amplifier circuit 89 detects an offset voltage on the basis of the reference voltage 90 serving as the linear operation upper limit voltage of the output signal and the peak voltage detected by the peak detector circuit 87, generates an offset compensation voltage by inverting the polarity of the detected offset voltage, and feeds back the generated offset compensation voltage to the differential amplifier circuit 83. As a result, the offset voltage can be automatically compensated.

By providing the offset compensation voltage generator circuit 88 with a gain, the offset voltage can be further reduced. Denoting an offset voltage generated in the output of the differential amplifier circuit 83 by $V_{OFFOUT}$, an offset voltage contained in the input signal of the differential amplifier circuit 83 by $V_{OFFIN}$, an offset compensation voltage fed back to the differential amplifier circuit 83 by $\Delta V$, and a gain of the differential amplifier circuit 83 by G1, the offset voltage $V_{OFFOUT}$ is represented by the following equation (1).

$$V_{OFFOUT}=(V_{OFFIN}-\Delta V) \cdot G1 \qquad (1)$$

Denoting a detection efficiency of the peak detector circuit 87 by $\eta$, and again of the offset compensation voltage generator circuit 88 by "G2," the offset compensation voltage $\Delta V$ is represented by the following equation (2).

$$\Delta V = V_{OFFOUT} \cdot \eta \cdot G2 \qquad (2)$$

By substituting the equation (2) into the equation (1) and rewriting a resultant equation, the offset voltage $V_{OFFOUT}$ is represented by the following equation (3).

$$V_{OFFOUT}=(G1/(1+G1 \cdot \eta \cdot G2)) \cdot V_{OFFIN} \qquad (3)$$

Supposing $(G1 \cdot \eta \cdot G2) \gg 1$, the equation (3) can be represented as equation (4).

$$V_{OFFOUT} \approx (1/(\eta \cdot G2)) \cdot V_{OFFIN} \qquad (4)$$

For example, in the case where $\eta=0.5$ and G2=30 dB, it follows that $V_{OFFOUT} \approx (1/16) \cdot V_{OFFIN}$. The offset voltage generated in the output of the differential amplifier circuit 83 is thus reduced.

According to the above-described conventional technique, however, the offset compensation voltage generated by the offset compensation voltage generator circuit is fed back to the differential amplifier circuit as it is. This results in a problem that an excessive offset compensation voltage is fed back and consequently stable offset compensation cannot be conducted in some cases. For example, if the amplitude of the input signal exceeds the linear operation range of the differential amplifier circuit, resultant saturation of the peak detection value hinders an accurate offset compensation voltage from being generated, disadvantageously resulting in occurrence of an unstable feedback operation.

Especially, when the offset compensation voltage generation circuit is provided with a gain for reducing the offset voltage, an excessive offset compensation voltage is disadvantageously fed back for the offset voltage that has actually occurred in the output. Furthermore, if the differential amplifier circuit is an equalization amplifier circuit, a large amplitude signal input lowers the gain of the equalization amplifier circuit, and consequently the gain of the offset compensation voltage generator circuit becomes dominant in the feedback loop, and an excessive offset compensation voltage is disadvantageously fed back for the offset voltage that has actually occurred in the output.

It is an object of the present invention to provide an amplifier circuit that makes it possible to limit an excessive offset compensation voltage and conduct stable offset compensation.

DISCLOSURE OF THE INVENTION

The amplifier circuit according to this invention comprises a differential amplifier unit which includes one or more differential amplifier circuits; a detector unit which detects a peak value of an output voltage of the differential amplifier unit; a generator unit which generates an offset compensation voltage for offset compensation based on a detection result of the detector unit; and a limiter unit which limits the offset compensation voltage generated by the generator unit into a predetermined range and feeding back the limited offset compensation voltage to the differential amplifier unit.

According to the above-mentioned invention, the differential amplifier unit conducts amplification, and the detector unit detects a peak value of an output voltage of the differential amplifier unit. The generator unit generates an offset compensation voltage for offset compensation on the basis of a detection result of the detector unit, and the limiter unit limits the offset compensation voltage generated by the generator unit into a predetermined range and feeds back the limited offset compensation voltage to the differential amplifier unit. As a result, the offset compensation voltage fed back to the differential amplifier unit can be limited into a predetermined range.

In the above-mentioned amplifier circuit according to this invention, the limiter unit generates a bias voltage of the differential amplifier unit.

Thus, since the limiter unit generates a bias voltage of the differential amplifier unit, it becomes possible to generate the bias voltage of the differential amplifier unit in the amplifier circuit. Therefore, it becomes unnecessary to input the bias voltage of the differential amplifier unit from the outside.

In the above-mentioned amplifier circuit according to this invention, the detector unit detects the peak value and an intermediate value of the output voltage of the differential amplifier unit, generates a first reference voltage by adding a predetermined external voltage to a voltage of the intermediate value, and outputs the peak value and the first reference voltage to the generator unit, and the generator unit generates the offset compensation voltage on the basis of the peak value and the first reference voltage fed from the generator unit.

Thus, the detector unit detects the peak value and an intermediate value of the output voltage of the differential amplifier unit, generates a first reference voltage by adding a predetermined external voltage to a voltage of the intermediate value, and outputs the peak value and the first reference voltage to the generator unit, and the generator unit generates the offset compensation voltage on the basis of the peak value and the first reference voltage fed from the generator unit. As a result, a suitable first reference voltage can be generated by taking an intermediate value kept constant even if the offset of the output signal has shifted and adjusting a predetermined external voltage. The offset compensation voltage can be generated on the basis of the first reference voltage.

In the above-mentioned amplifier circuit according to this invention, the generator unit comprises a second reference voltage output unit which outputs a second reference voltage to the limiter unit, an operational amplifier having an output terminal connected to an input terminal of the offset compensation voltage of the limiter unit, a first resistor provided between a negative-phase input terminal of the operational amplifier and an output terminal of the peak value of the detector unit, a second resistor provided between a positive-phase input terminal of the operational amplifier and an output terminal of the first reference voltage of the detector unit, a third resistor provided between the negative-phase input terminal and the output terminal of the operational amplifier, and a fourth resistor between an output terminal of the second reference voltage output unit and the positive-phase input terminal of the operational amplifier.

Thus, since the generator unit comprises the second reference voltage output unit which outputs a second reference voltage to the limiter unit, the operational amplifier having an output terminal connected to an input terminal of the offset compensation voltage of the limiter unit, the first resistor provided between a negative-phase input terminal of the operational amplifier and an output terminal of the peak value of the detector unit, the second resistor provided between a positive-phase input terminal of the operational amplifier and an output terminal of the first reference voltage of the detector unit, the third resistor provided between the negative-phase input terminal and the output terminal of the operational amplifier, and the fourth resistor between an output terminal of the second reference voltage output unit and the positive-phase input terminal of the operational amplifier, the gain can be determined by using the ratio between the first resistor and the third resistor (the ratio between the second resistor and the fourth resistor).

In the above-mentioned amplifier circuit according to this invention, the limiter unit comprises a first transistor having a base connected to an output terminal of the offset compensation voltage of the generator unit and a collector connected to a negative-phase input terminal of the differential amplifier unit, a second transistor having an emitter connected to an emitter of the first transistor, a collector connected to a positive-phase input terminal of the differential amplifier unit, and a base supplied with the second reference voltage, a third transistor having a collector connected to the emitter of the first transistor and the emitter of the second transistor, and a base supplied with a voltage for adjustment, a fifth resistor provided between an emitter of the third transistor and a low potential side of a power supply, a sixth resistor having one terminal connected to the collector of the first transistor, a seventh resistor provided between the collector of the second transistor and the other terminal of the sixth resistor, and an eighth resistor provided between the other end of the sixth resistor and a high potential side of the power supply.

Thus, since the limiter unit comprises the first transistor having a base connected to an output terminal of the offset compensation voltage of the generator unit and a collector connected to a negative-phase input terminal of the differential amplifier unit, the second transistor having an emitter connected to an emitter of the first transistor, a collector connected to a positive-phase input terminal of the differential amplifier unit, and a base supplied with the second reference voltage, the third transistor having a collector connected to the emitter of the first transistor and the emitter of the second transistor, and a base supplied with a voltage for adjustment, the fifth resistor provided between an emitter of the third transistor and a low potential side of a power supply, the sixth resistor having one terminal connected to the collector of the first transistor, the seventh resistor provided between the collector of the second transistor and the other terminal of the sixth resistor, and the eighth resistor provided between the other end of the sixth resistor and a high potential side of the power supply, the offset compensation voltage can be limited into a predetermined range.

In the above-mentioned amplifier circuit according to this invention, the limiter unit comprises a first transistor having a base connected to an output terminal of the offset compensation voltage of the generator unit and a collector connected to a negative-phase input terminal of the differential amplifier unit, a second transistor having an emitter connected to an emitter of the first transistor, a collector connected to a positive-phase input terminal of the differential amplifier unit, and a base supplied with the second reference voltage, a third transistor having a collector connected to the emitter of the first transistor and the emitter of the second transistor, and a base supplied with a voltage for adjustment, a fifth resistor provided between an emitter of the third transistor and a low potential side of a power supply, a sixth resistor provided between the collector of the first transistor and a high potential side of the power supply, a seventh resistor provided between the collector of the second transistor and the high potential side of the power supply, an eighth resistor provided between the collector of the first transistor and the low potential side of the power supply, and a ninth resistor provided between the collector of the second transistor and the low potential side of the power supply.

Thus, since the limiter unit comprises a first transistor having a base connected to an output terminal of the offset compensation voltage of the generator unit and a collector connected to a negative-phase input terminal of the differential amplifier unit, a second transistor having an emitter connected to an emitter of the first transistor, a collector connected to a positive-phase input terminal of the differential amplifier unit, and a base supplied with the second reference voltage, a third transistor having a collector connected to the emitter of the first transistor and the emitter of the second transistor, and a base supplied with a voltage for adjustment, a fifth resistor provided between an emitter of the third transistor and a low potential side of a power supply, a sixth resistor provided between the collector of the first transistor and a high potential side of the power supply, a seventh resistor provided between the collector of the second transistor and the high potential side of the power supply, an eighth resistor provided between the collector of the first transistor and the low potential side of the power supply, and a ninth resistor provided between the collector of the second transistor and the low potential side of the power supply, the offset compensation voltage can be limited into a predetermined range.

BEST MODE FOR CARRYING OUT THE INVENTION

Figure 1:
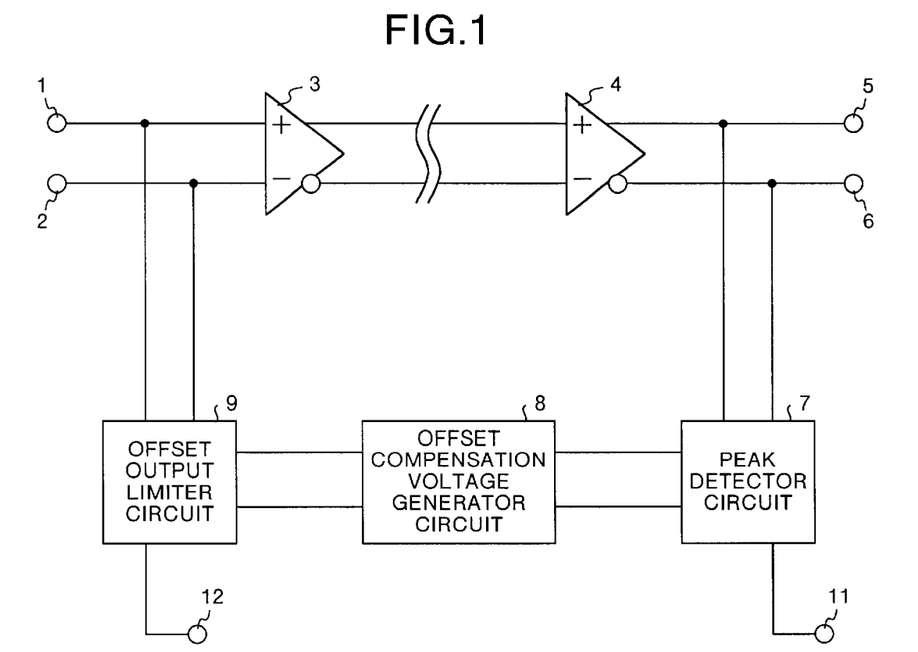
FIG. 1 is a diagram showing a configuration of an amplifier circuit according to a first embodiment of the present invention.

Embodiments of the amplifier circuit according to the present invention will be described in detail by referring to the accompanying drawing. However, the present invention is not restricted by the embodiments.
First Embodiment An amplifier circuit according to a first embodiment of the present invention will now be described by taking an ampli-
fier circuit (semiconductor integrated circuit) having multi-stage connected differential amplifier circuits used in optical communication systems as an example. FIG. 1 is a diagram showing a configuration of an amplifier circuit according to a first embodiment of the present invention. This amplifier circuit includes a plurality of differential amplifier circuits 3 to 4 multi-stage connected so as to output a positive-phase output signal and a negative-phase output signal respectively to a positive-phase input terminal and a negative-phase input terminal of a differential amplifier circuit of the next stage. Moreover, a positive-phase input signal and a negative-phase input signal is supplied from the outside to the differential amplifier circuit 3 (first in the multi-stage) through respectively a positive-phase input terminal 1 and a negative-phase input terminal 2. Moreover, the differential amplifier circuit 4 (last in the multi-stage) outputs to the outside a positive-phase output signal and a negative-phase output signal through respectively a positive-phase output terminal 5 and a negative-phase output terminal 6.

The amplifier circuit also includes a reference voltage adjusting terminal 11 for inputting a reference voltage adjusting voltage to be used to generate a reference voltage (first reference voltage) from the outside. Moreover, there is provided a peak detector circuit 7 that is supplied with the positive-phase output signal and the negative-phase output signal from the differential amplifier circuit 4 of the last stage to detect a peak value and an intermediate value of the signals and supplied with the reference voltage adjusting voltage from the reference voltage adjusting terminal 11 to output the reference voltage and a peak value of the positive-phase output signal or the negative-phase output signal.

The amplifier circuit further includes an offset compensation voltage generator circuit 8 supplied with the peak value and the reference voltage from the peak detector circuit 7 to generate an offset compensation voltage and output the generated offset compensation voltage and a reference voltage of an offset compensation voltage (second reference voltage). Moreover, there are provided an offset limit value adjusting terminal 12 that is supplied with an offset limit value adjusting voltage to be used to adjust a limit value of the offset compensation voltage, and an offset output limiter circuit 9 supplied with the offset compensation voltage and the reference voltage of the offset compensation voltage from the offset compensation voltage generator circuit 8 and the offset limit value adjusting voltage from the offset limit value adjusting terminal 12 to feedback a limited offset compensation voltage to the positive-phase input terminal 1 and the negative-phase input terminal 2 of the differential amplifier circuit 3 of the first stage.

As explained above, the differential amplifier circuits 3 to 4 are provided in a plurality and connected one after the other in multi-stages. The first differential amplifier circuit 3 is supplied with a positive-phase input signal and a negative-phase input signal from the outside respectively via the positive-phase input terminal 1 and the negative-phase input terminal 2. This first differential amplifier circuit 3 outputs a positive-phase output signal and a negative-phase output signal to a positive-phase input terminal and a negative-phase input terminal of the next differential amplifier circuit, respectively. Thus, each differential amplifier circuit outputs a positive-phase output signal and a negative-phase output signal to a positive-phase input terminal and a negative-phase input terminal of the next differential amplifier circuit, respectively. The last differential amplifier circuit 4 outputs a positive-phase output signal and a negative-phase output signal to the outside via the positive-phase input terminal 5 and the negative-phase input terminal 6, respectively.

The peak detector circuit 7 is supplied with the positive-phase output signal and the negative-phase output signal from the differential amplifier circuit 4 of the last stage. The peak detector circuit 7 detects a peak value and an intermediate value of the positive-phase output signal and the negative-phase output signal supplied thereto. If the offset shifts, the intermediate value becomes a fixed value. Furthermore, the peak detector circuit 7 is supplied with the reference voltage adjusting voltage from the outside via the reference voltage adjusting terminal 11. The peak detector circuit 7 generates the reference voltage on the basis of the supplied reference voltage adjusting voltage and the detected intermediate value. The peak detector circuit 7 is not especially restricted in configuration. For example, a configuration similar to that of the conventional peak detector circuit 87 described earlier may also be used.

The reference voltage adjusting voltage is a voltage adjusted so that the sum of it and the intermediate value will become the peak value (initial peak detection value) of the output signal when the offset voltage is 0 volt. In other words, the reference voltage adjusting voltage is a voltage adjusted so as to become the difference between initial peak detection value and the intermediate value. By adding this reference voltage adjusting voltage to a voltage of the intermediate value, the peak detector circuit 7 generates a reference voltage adjusted to become the initial peak detection value. The peak detector circuit 7 outputs this reference voltage and the peak value of the positive-phase output signal or the negative-phase output signal to the offset compensation voltage generator circuit 8.

The offset compensation voltage generator circuit 8 is supplied with the peak value and the reference voltage from the peak detector circuit 7. The offset compensation voltage generator circuit 8 generates the offset compensation voltage to be used for offset compensation, which makes the difference between the peak value and the reference voltage equal to 0, i.e., which makes the offset voltage equal to 0 volt, and outputs the generated offset compensation voltage and reference voltage (second reference voltage) of the offset compensation voltage to the offset output limiter circuit 9. The offset compensation voltage generator circuit 8 is not especially restricted in configuration. For example, a configuration similar to that of the conventional offset compensation voltage generator circuit 88 described earlier may also be used.

The offset output limiter circuit 9 is supplied with the offset compensation voltage and the reference voltage of the offset compensation voltage from the offset compensation voltage generator circuit 8, and supplied with the offset limit value adjusting voltage from the offset limit value adjusting terminal 12. The offset output limiter circuit 9 limits the offset compensation voltage to a voltage in a predetermined range, and feeds back the limited offset compensation voltage to the positive-phase input terminal 1 and the negative-phase input terminal 2 of the differential amplifier circuit 3 of the first stage. In other words, the offset output limiter circuit 9 limits the offset compensation voltage into a range between an upper limit and a lower limit of the offset output determined by the offset limit value adjusting terminal 12, and outputs the limited offset compensation voltage.

The limited offset compensation voltage is set so as to meet a DC bias condition of the positive-phase input terminal 1 and the negative-phase input terminal 2 of the differential amplifier circuit 3 of the first stage. In other words, the bias of the differential amplifier circuit 3 of the first stage is not supplied from the outside, but generated and supplied by the offset output limiter circuit 9. In addition, the differential amplifier circuits 3 to 4 correspond to differential amplifier unit of this invention. The peak detector circuit 7 corresponds to a detector unit of this invention. The offset compensation voltage generator circuit 8 corresponds to a generator unit of this invention. The offset output limiter circuit 9 corresponds to a limiter unit of this invention.

How the amplifier circuit according to the first embodiment operates will now be described. First, the positive-phase input signal and the negative-phase input signal are supplied via the positive-phase input terminal 1 and the negative-phase input terminal 2 of the differential amplifier circuit 3 of the first stage, respectively. The supplied positive-phase input signal and the negative-phase input signal are amplified by a total gain of the differential amplifier circuits ranging from the differential amplifier circuit 3 of the first stage to the differential amplifier circuit 4 of the last stage. A positive-phase output signal and a negative-phase output signal are output from the differential amplifier circuit 4 of the last stage to the positive-phase output terminal 5 and the negative-phase output terminal 6, respectively. The positive-phase output signal and the negative-phase output signal supplied from the differential amplifier circuit 4 of the last stage contain an offset voltage caused by dispersion in temperature, power supply voltage and transistor characteristics.

The positive-phase output signal and the negative-phase output signal supplied from the differential amplifier circuit 4 of the last stage are supplied to the peak detector circuit 7. The peak detector circuit 7 detects a peak value of the positive-phase output signal and the negative-phase output signal, and an intermediate value of the positive-phase output signal and the negative-phase output signal. The reference voltage adjusting voltage is added to a voltage of this intermediate value, and a reference voltage having the same value as the initial peak detection value is generated. The peak detector circuit 7 outputs the generated reference voltage and the detected peak value of the positive-phase output signal or the negative-phase output signal to the offset compensation voltage generator circuit 8.

The offset compensation voltage generator circuit 8 inverts and amplifies a voltage of a difference between the peak value and the reference voltage, and thereby generates the offset compensation voltage. Furthermore, the offset compensation voltage generator circuit 8 generates the reference voltage of the offset compensation voltage. The gain of the offset compensation voltage generator circuit 8 functions effectively in reducing the offset voltage in the output of the differential amplifier circuit 4 of the last stage.

Supposing that the gain of the offset compensation voltage generator circuit 8 is 30 dB and the detection efficiency of the peak detector circuit 7 is 0.5, and denoting the offset voltage in the output of the differential amplifier circuit 4 of the last stage by $V_{OFFOUT}$ and the offset voltage of the positive-phase input signal and the negative-phase input signal supplied respectively via the positive-phase input terminal 1 and the negative-phase input terminal 2 by $V_{OFFIN}$, the relation $V_{OFFOUT} \approx (1/16) V_{OFFIN}$ is satisfied. As compared with the offset voltage $V_{OFFIN}$, the offset voltage $V_{OFFOUT}$ can be reduced. The generated offset compensation voltage is limited by the offset output limiter circuit 9, and output to the positive-phase input terminal 1 and the negative-phase input terminal 2 of the differential amplifier circuit 3 of the first stage.

a) Offset Compensation Voltage Generator Circuit

Figure 2:
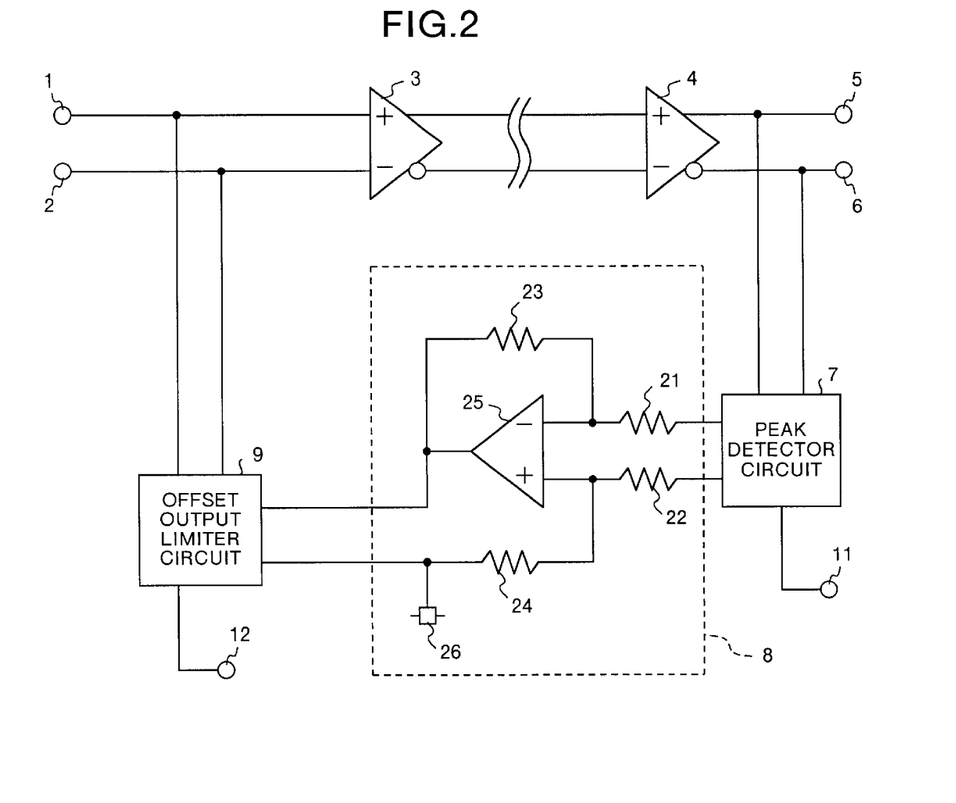
FIG. 2 is a diagram showing a configuration example of an offset compensation voltage generator circuit showed in FIG. 1.

The offset compensation voltage generator circuit 8 will now be described more concretely by referring to FIG. 2. FIG. 2 is a diagram showing a configuration example of the offset compensation voltage generator circuit 8 showed in FIG. 1. The offset compensation voltage generator circuit 8 includes an offset compensation voltage reference voltage source 26 for outputting the reference voltage of the offset compensation voltage to the offset output limiter circuit 9, an operational amplifier 25 having an output terminal connected to an input terminal of the offset compensation voltage of the offset output limiter circuit 9, a resistor 21 provided between a negative-phase input terminal of the operational amplifier 25 and an output terminal of a peak value of the peak detector circuit 7, a resistor 22 provided between a positive-phase input terminal of the operational amplifier 25 and an output terminal of the reference voltage of the peak detector circuit 7, a resistor 23 provided between the negative-phase input terminal and an output terminal of the operational amplifier 25, and a resistor 24 provided between the offset compensation voltage reference voltage source 26 and the positive-phase input terminal of the operational amplifier 25.

In this offset compensation voltage generator circuit 8, the gain is determined by the resistors 21 to 24. Denoting resistance values of the resistors 21, 22, 23 and 24 respectively by R1, R2, R3 and R4 and the gain of the offset compensation voltage generator circuit 8 by G3, when R1=R1 and R3=R4, the relation G3=R3/R1=R4/R2 holds true. Denoting an offset voltage generated in the output of the differential amplifier circuit 4 of the last stage by $V_{OFFOUT}$, an initial offset voltage contained in the input signal of the differential amplifier circuit 3 by $V_{OFFIN}$, and the detection efficiency of the peak detector circuit 7 by η, the following equation holds true.

$$V_{OFFOUT} \approx (1/(G3 \times \eta)) \times V_{OFFIN} \qquad (5)$$

By adjusting the resistance values R1 to R4, the gain G3 of the offset compensation voltage generator circuit 8 can be set to an arbitrary value.

b) Offset Output Limiter Circuit

Figure 3:
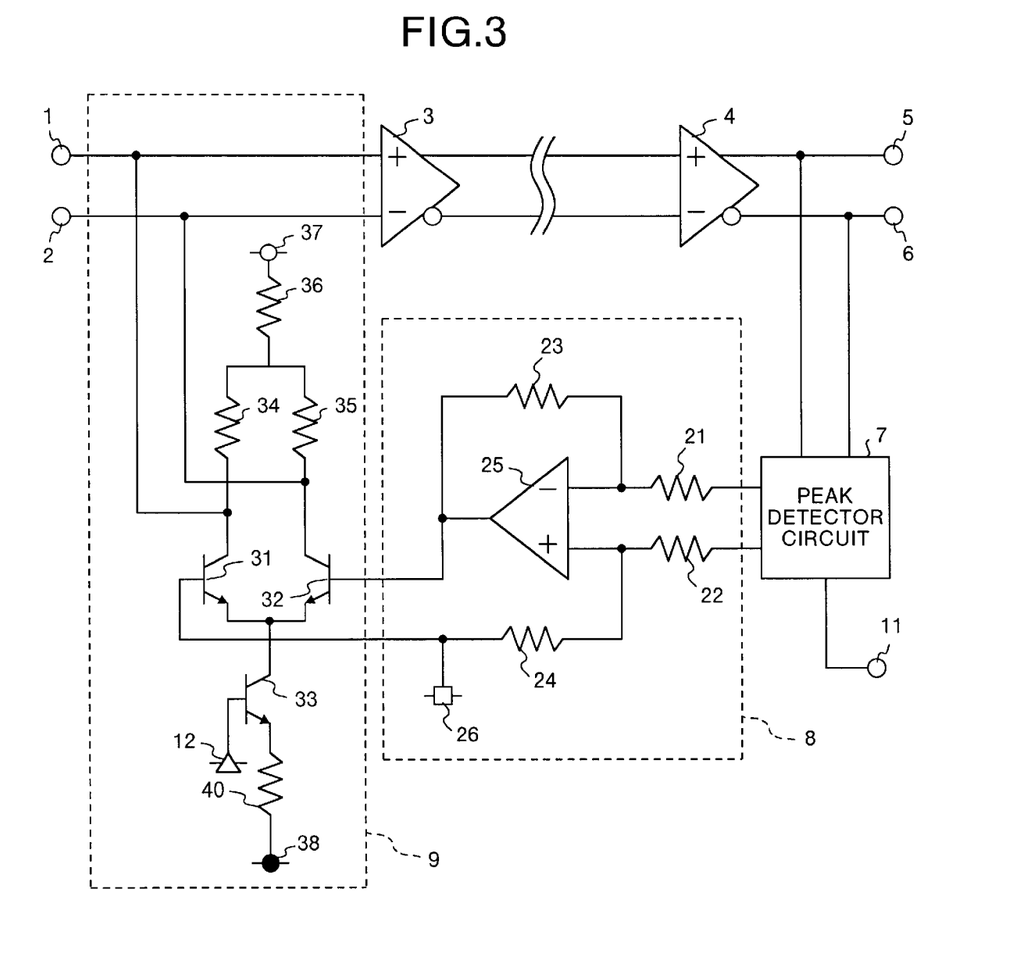
FIG. 3 is a diagram showing a configuration example of an offset output limiter circuit showed in FIG. 1.

The offset output limiter circuit 9 will now be described more concretely by referring to FIG. 3. FIG. 3 is a diagram showing a configuration example of the offset output limiter circuit 9 showed in FIG. 1. The offset output limiter circuit 9 includes an NPN transistor 32 connected at its base to an output terminal of the offset compensation voltage of the offset compensation voltage generator circuit 8 (an output terminal of an operational amplifier 25) and connected at its collector to the negative-phase input terminal 2; and an NPN transistor 31 connected at its emitter to an emitter of the NPN transistor 32, connected at its collector to the positive-phase input terminal 1, and connected at its base to the offset compensation voltage reference voltage source 26.

Furthermore, the offset output limiter circuit 9 includes an NPN transistor 33 connected at its collector to the emitter of the NPN transistor 31 and the emitter of the NPN transistor 32 and connected at its base to the offset limit value adjusting terminal 12; a resistor 40 provided between an emitter of the NPN transistor 33 and a low potential side 38 of power supply; a resistor 35 connected at one of its ends to the collector of the NPN transistor 32; a resistor 34 provided between the collector of the NPN transistor 31 and the other of its ends of the resistor 35; and a resistor 36 provided between the other of its ends of the resistor 35 and a high potential side 37 of the power supply.

The NPN transistors 31 and 32 and the resistors 34, 35 and 36 form a differential amplifier circuit. A current I that flows through this differential amplifier circuit is determined by the NPN transistor 33 (the offset limit value adjusting voltage of the offset limit value adjusting terminal 12) and a resistor 40. Denoting resistance values of the resistors 34, 35 and 36 respectively by R5, R6 and R7, and denoting the voltage value of the high potential side 37 of the power supply by $V_{REG}$, an output voltage $V_{dccont}$ output from the offset output limiter circuit 9 to the input section of the differential amplifier circuit 3 of the first stage is represented by the following equation (6).

$$V_{dccont} = (V_{REG} - (R \times I)) + (R5 \times I) \qquad (6)$$

In this way, the output voltage $V_{dccont}$ is in the range of (R5×I) or (R6×I) [Vpp] around (R7×I).

By making the base voltage of the NPN transistor 33 adjustable from the outside and adjusting the current I, an upper limit value and a lower limit value of the offset compensation voltage can be set. Especially, by setting the value of (R5×I) in the linear operation range of the multi-stage connected differential amplifier circuits 3 to 4, the offset compensation voltage can be prevented from shifting from the linear operation range of the differential amplifier circuits 3 to 4. For example, if an input range in which the linear operation of the differential amplifier circuits 3 to 4 is possible is 100 mVpp, offset compensation can be conducted certainly in the linear operation range of the differential amplifier circuits 3 to 4 by adjusting the current I so as to satisfy the relation (R5×I)≦100 mVpp.

According to the first embodiment, the offset output limiter circuit 9 limits the offset compensation voltage to the inside of a predetermined range as described earlier. Therefore, it is possible to prevent an excessive offset compensation voltage from being generated for the offset voltage that has actually occurred in the amplifier circuits and fed back. Furthermore, since excessive offset compensation voltage is limited, the allowable range of the gain setting value of the offset compensation voltage generator circuit 8 can be widened. Furthermore, according to the first embodiment, an excessive offset compensation voltage can be limited and stable automatic offset adjustment can be conducted no matter whether the multi-stage connected differential amplifier circuits perform linear operation.

Especially, when the multi-stage differential amplifier circuits are equalization amplifier circuits, a large input amplitude lowers the gain of the equalization amplifier circuits, makes the gain of the offset compensation voltage generator circuit 8 dominant, and increases the possibility that an excessive offset compensation voltage will be generated for an offset voltage that has actually occurred in the amplifier circuits. Since the offset output limiter circuit 9 limits the offset compensation voltage into the predetermined range, however, an excessive offset compensation voltage can be prevented from being fed back. Even if one or a small number of differential amplifier circuits are used, a similar effect is obtained.

Furthermore, the offset compensation voltage generator circuit 8 includes the offset compensation voltage reference voltage source 26 for outputting the reference voltage of the offset compensation voltage to the offset output limiter circuit 9, the operational amplifier 25 having an output terminal connected to the input terminal of the offset compensation voltage of the offset output limiter circuit 9, the resistor 21 provided between the negative-phase input terminal of the operational amplifier 25 and the output terminal of the peak value of the peak detector circuit 7, the resistor 22 provided between the positive-phase input terminal of the operational amplifier 25 and the output terminal of the reference voltage of the peak detector circuit 7, the resistor 23 provided between the negative-phase input terminal and the output terminal of the operational amplifier 25, and the resistor 24 provided between the offset compensation voltage reference voltage source 26 and the positive-phase input terminal of the operational amplifier 25. As a result, the gain can be determined by the ratio between the resistance values R1 and R3 (the ratio between the resistance values R2 and R4) Therefore, the gain G3 of the offset compensation voltage generator circuit 8 can be set to an arbitrary value easily.

Furthermore, the offset output limiter circuit 9 includes the NPN transistor 32 connected at its base to the output terminal of the offset compensation voltage of the offset compensation voltage generator circuit 8 (the output terminal of the operational amplifier 25) and connected at its collector to the negative-phase input terminal 2; the NPN transistor 31 connected at its emitter to an emitter of the NPN transistor 32, connected at its collector to the positive-phase input terminal 1, and connected at its base to the offset compensation voltage reference voltage source 26; the NPN transistor 33 connected at its collector to the emitter of the NPN transistor 31 and the emitter of the NPN transistor 32 and connected at its base to the offset limit value adjusting terminal 12; the resistor 40 provided between the emitter of the NPN transistor 33 and the low potential side 38 of power supply; the resistor 35 connected at one of its ends to the collector of the NPN transistor 32; the resistor 34 provided between the collector of the NPN transistor 31 and the other of its ends of the resistor 35; and the resistor 36 provided between the other of its ends of the resistor 35 and the high potential side 37 of the power supply. By setting the (R5×I) value into the linear operation range of the differential amplifier circuits 3 to 4, therefore, the offset compensation can be conducted certainly in the linear operation range of the differential amplifier circuits 3 to 4.

Second Embodiment

Figure 4:
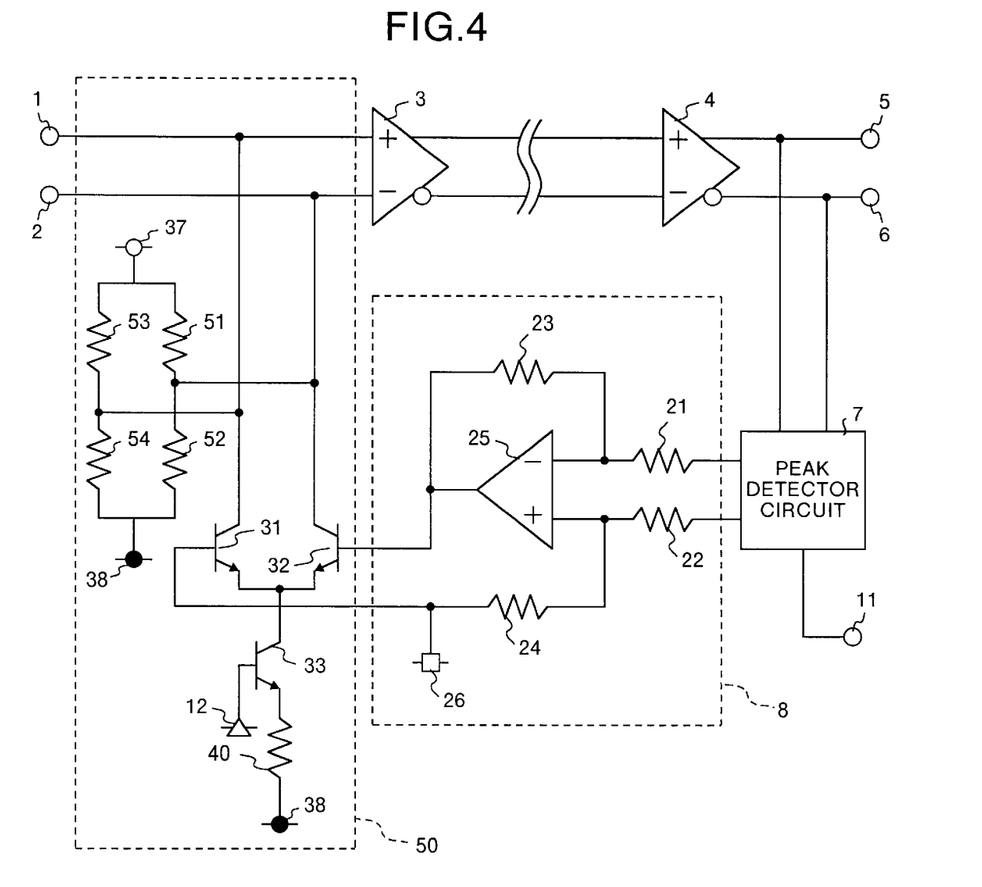
FIG. 4 is a diagram showing a configuration of an amplifier circuit according to a second embodiment of the present invention.

A second embodiment according to the present invention is obtained by altering the configuration of the offset output limiter circuit in the above-described first embodiment. Since the basic configuration and operation are similar to those of the first embodiment, only the offset output limiter circuit, which is a different portion, will now be described. FIG. 4 is a diagram showing a configuration of an amplifier circuit according to an embodiment of the present invention. Components that are the same as those of FIG. 3 are denoted by like characters. This amplifier circuit has an offset output limiter circuit 50.

The offset output limiter circuit 50 includes an NPN transistor 32 connected at its base to an output terminal of the offset compensation voltage of the offset compensation voltage generator circuit 8 (an output terminal of an operational amplifier 25) and connected at its collector to the negative-phase input terminal 2; and an NPN transistor 31 connected at its emitter to an emitter of the NPN transistor 32, connected at its collector to the positive-phase input terminal 1, and connected at its base to the offset compensation voltage reference voltage source 26; an NPN transistor 33 connected at its collector to the emitter of the NPN transistor 31 and the emitter of the NPN transistor 32 and connected at its base to the offset limit value adjusting terminal 12; a resistor 40 provided between an emitter of the NPN transistor 33 and a low potential side 38 of power supply; a resistor 51 provided between the collector of the NPN transistor 32 and a high potential side 37 of the power supply; a resistor 52 provided between the collector of the NPN transistor 32 and a low potential side 38 of the power supply; a resistor 53 provided between the collector of the NPN transistor 31 and the high potential side 37 of the power supply; and a resistor 54 provided between the collector of the NPN transistor 31 and the low potential side 38 of the power supply.

The NPN transistors 31 and 32 and the resistors 51, 52, 53 and 54 form a differential amplifier circuit. A current I that flows through this differential amplifier circuit is determined by the NPN transistor 33 (the offset limit value adjusting voltage of the offset limit value adjusting terminal 12) and a resistor 40. When the resistances of the resistors 51, 52, 53 and 54 are assumed to be respectively by R8, R9, R10 and R11, and when the voltage of the high potential side 37 of the power supply by $V_{REG}$ is assumed to be, an offset voltage $+V_{off}$ at the positive-phase input terminal 1 of the differential amplifier circuit 3 of the first stage and an offset voltage $-V_{off}$ at the negative-phase input terminal 2 are represented by the following equations (7) and (8), respectively.

$$+V_{off}=((R8 \cdot R9)/(R8+R9)) \cdot I \qquad (7)$$

$$-V_{off}=((R10 \cdot R11)/(R10+R11)) \cdot I \qquad (8)$$

By making the base voltage of the NPN transistor 33 adjustable from the outside and adjusting the current I, an upper limit value and a lower limit value of the offset compensation voltage can be set. Especially, by setting the values of $+V_{off}$ and $-V_{off}$ in the linear operation range of the multi-stage connected differential amplifier circuits 3 to 4, the offset compensation voltage can be prevented from shifting from the linear operation range of the differential amplifier circuits 3 to 4. For example, if an input range in which the linear operation of the differential amplifier circuits 3 to 4 is possible is 100 mVpp, offset compensation can be conducted certainly in the linear operation range of the differential amplifier circuits 3 to 4 by setting $+V_{off}$ and $-V_{off}$ so as to satisfy the relation $+V_{off}, -V_{off} \leq 100$ mVpp.

As described above, the offset output limiter circuit 50 according to the second embodiment includes the NPN transistor 32 connected at its base to the output terminal of the offset compensation voltage of the offset compensation voltage generator circuit 8 (the output terminal of the operational amplifier 25) and connected at its collector to the negative-phase input terminal 2; and the NPN transistor 31 connected at its emitter to the emitter of the NPN transistor 32, connected at its collector to the positive-phase input terminal 1, and connected at its base to the offset compensation voltage reference voltage source 26; the NPN transistor 33 connected at its collector to the emitter of the NPN transistor 31 and the emitter of the NPN transistor 32 and connected at its base to the offset limit value adjusting terminal 12; the resistor 40 provided between the emitter of the NPN transistor 33 and the low potential side 38 of the power supply; the resistor 51 provided between the collector of the NPN transistor 32 and the high potential side 37 of the power supply; the resistor 52 provided between the collector of the NPN transistor 32 and the low potential side 38 of the power supply; the resistor 53 provided between the collector of the NPN transistor 31 and the high potential side 37 of the power supply; and the resistor 54 provided between the collector of the NPN transistor 31 and the low potential side 38 of the power supply. By setting $+V_{off}$ and $-V_{off}$ so as to satisfy the relation $+V_{off}, -V_{off} \leq 100$ mVpp, therefore, offset compensation can be conducted certainly in the linear operation range of the differential amplifier circuits 3 to 4.

As heretofore described, according to this invention, a differential amplifier unit conducts amplification, and the detector unit detects a peak value of an output voltage of the differential amplifier unit. The generator unit generates an offset compensation voltage for offset compensation on the basis of a detection result of the detector unit, and the limiter unit limits the offset compensation voltage generated by the generator unit into a predetermined range and feeds back the limited offset compensation voltage to the differential amplifier unit. As a result, the offset compensation voltage fed back to the differential amplifier unit can be limited into a predetermined range. This brings about an effect that an excessive offset compensation voltage is limited and stable offset compensation can be conducted.

According to the next invention, the limiter unit generates a bias voltage of the differential amplifier unit. As a result, it becomes possible to generate the bias voltage of the differential amplifier unit in the amplifier circuit. It becomes unnecessary to input the bias voltage of the differential amplifier unit from the outside. This brings about an effect that the external circuit can be simplified.

According to the next invention, the detector unit detects the peak value and an intermediate value of the output voltage of the differential amplifier unit, generates a first reference voltage by adding a predetermined external voltage to a voltage of the intermediate value, and outputs the peak value and the first reference voltage to the generator unit, and the generator unit generates the offset compensation voltage on the basis of the peak value and the first reference voltage fed from the generator unit. As a result, a suitable first reference voltage can be generated by taking an intermediate value kept constant even if the offset of the output signal has shifted and adjusting a predetermined external voltage. The offset compensation voltage can be generated on the basis of the first reference voltage. This brings about an effect that a suitable offset compensation voltage can be generated.

According to the next invention, the generator unit comprises: a second reference voltage output unit which outputs a second reference voltage to the limiter unit; an operational amplifier having an output terminal connected to an input terminal of the offset compensation voltage of the limiter unit; a first resistor provided between a negative-phase input terminal of the operational amplifier and an output terminal of the peak value of the detector unit; a second resistor provided between a positive-phase input terminal of the operational amplifier and an output terminal of the first reference voltage of the detector unit; a third resistor provided between the negative-phase input terminal and the output terminal of the operational amplifier; and a fourth resistor between an output terminal of the second reference voltage output unit and the positive-phase input terminal of the operational amplifier. The gain can be determined by using the ratio between the first resistor and the third resistor (the ratio between the second resistor and the fourth resistor). This brings about an effect that the gain setting of the generator unit can be conducted easily.

According to the next invention, the limiter unit comprises a first transistor having a base connected to an output terminal of the offset compensation voltage of the generator unit and a collector connected to a negative-phase input terminal of the differential amplifier unit; a second transistor having an emitter connected to an emitter of the first transistor, a collector connected to a positive-phase input terminal of the differential amplifier unit, and a base supplied with the second reference voltage; a third transistor having a collector connected to the emitter of the first transistor and the emitter of the second transistor, and a base supplied with a voltage for adjustment; a fifth resistor provided between an emitter of the third transistor and a low potential side of a power supply; a sixth resistor having one terminal connected to the collector of the first transistor; a seventh resistor provided between the collector of the second transistor and the other terminal of the sixth resistor; and an eighth resistor provided between the other end of the sixth resistor and a high potential side of the power supply. This results in an effect that the offset compensation voltage can be limited into a predetermined range.

According to the next invention, the limiter unit comprises a first transistor having a base connected to an output terminal of the offset compensation voltage of the generator unit and a collector connected to a negative-phase input terminal of the differential amplifier unit; a second transistor having an emitter connected to an emitter of the first transistor, a collector connected to a positive-phase input terminal of the differential amplifier unit, and a base supplied with the second reference voltage; a third transistor having a collector connected to the emitter of the first transistor and the emitter of the second transistor, and a base supplied with a voltage for adjustment; a fifth resistor provided between an emitter of the third transistor and a low potential side of a power supply; a sixth resistor provided between the collector of the first transistor and a high potential side of the power supply; a seventh resistor provided between the collector of the second transistor and the high potential side of the power supply; an eighth resistor provided between the collector of the first transistor and the low potential side of the power supply; and a ninth resistor provided between the collector of the second transistor and the low potential side of the power supply. This results in an effect that the offset compensation voltage can be limited into a predetermined range.

Industrial Applicability

As heretofore described, an amplifier circuit according to the present invention is useful in amplifier circuits used in optical communication systems, and suitable for compensating the offset voltage generated by dispersion of transistor characteristics.

What is claimed is:

1. An amplifier circuit comprising:
   a differential amplifier unit which includes one or more differential amplifier circuits;
   a detector unit which detects a peak value of an output voltage of the differential amplifier unit;
   a generator unit which generates an offset compensation voltage for offset compensation based on a detection result of the detector unit; and
   a limiter unit which limits the offset compensation voltage generated by the generator unit into a predetermined range and feeds back the limited offset compensation voltage to the differential amplifier unit, wherein the detector unit detects the peak value and an intermediate value of the output voltage of the differential amplifier unit, generates a first reference voltage by adding a predetermined external voltage to a voltage of the intermediate value, and outputs the peak value and the first reference voltage to the generator unit,
   the generator unit generates the offset compensation voltage based on the peak value and the first reference voltage to the generator unit voltage fed from the generator unit.

2. The amplifier circuit, according to claim 1:
   wherein the limiter unit generates a bias voltage of the differential amplifier unit.

3. The amplifier circuit according to claim 1, wherein the generator unit comprises:
   a second reference voltage output unit which outputs a second reference voltage to the limiter unit;
   an operational amplifier having an output terminal connected to an input terminal of the offset compensation voltage of the limiter unit;

a first resistor provided between a negative-phase input terminal of said operational amplifier and an output terminal of the peak value of the detector unit;

a second resistor provided between a positive-phase input terminal of said operational amplifier and an output terminal of the first reference voltage of the detector unit;

a third resistor provided between the negative-phase input terminal and the output terminal of said operational amplifier; and a fourth resistor between an output terminal of the second reference voltage output unit and the positive-phase input terminal of said operational amplifier.

4. The amplifier circuit according to claim 3, wherein the limiter unit comprises:

a first transistor having a base connected to an output terminal of the offset compensation voltage of the generator unit and a collector connected to a negative-phase input terminal of the differential amplifier unit;

a second transistor having an emitter connected to an emitter of said first transistor, a collector connected to a positive-phase input terminal of the differential amplifier unit, and a base supplied with the second reference voltage;

a third transistor having a collector connected to the emitter of said first transistor and the emitter of said second transistor, and a base supplied with a voltage for adjustment;

a fifth resistor provided between an emitter of said third transistor and a low potential side of a power supply;

a sixth resistor having one terminal connected to the collector of said first transistor;

a seventh resistor provided between the collector of said second transistor and the other terminal of said sixth resistor; and an eighth resistor provided between the other end of said sixth resistor and a high potential side of the power supply.

5. The amplifier circuit according to claim 3, wherein the limiter unit comprises:

a first transistor having a base connected to an output terminal of the offset compensation voltage of the generator unit and a collector connected to a negative-phase input terminal of the differential amplifier unit;

a second transistor having an emitter connected to an emitter of said first transistor, a collector connected to a positive-phase input terminal of the differential amplifier unit, and a base supplied with the second reference voltage;

a third transistor having a collector connected to the emitter of said first transistor and the emitter of said second transistor, and a base supplied with a voltage for adjustment;

a fifth resistor provided between an emitter of said third transistor and a low potential side of a power supply;

a sixth resistor provided between the collector of said first transistor and a high potential side of the power supply;

a seventh resistor provided between the collector of said second transistor and the high potential side of the power supply;

an eighth resistor provided between the collector of said first transistor and the low potential side of the power supply; and a ninth resistor provided between the collector of said second transistor and the low potential side of the power supply.

6. A method of amplifying a signal through an amplifier circuit comprising:

applying said signal to a differential amplifier unit which includes one or more differential amplifier circuits;

detecting a peak value of an output voltage of the differential amplifier unit using a detector unit;

generating an offset compensation voltage for offset compensation based on a detection result of the detector unit using a generator unit; and limiting the offset compensation voltage generated by the generator unit into a predetermined range using a limiter unit, and feeding back the limited offset compensation voltage to the differential amplifier unit, wherein:

the detector unit detects the peak value and an intermediate value of the output voltage of the differential amplifier unit, generates a first reference voltage by adding a predetermined external voltage to a voltage of the intermediate value, and outputs the peak value and the first reference voltage to the generator unit, and the generator unit generates the offset compensation voltage based on the peak value and the first reference voltage to the generator unit voltage fed from the generator unit.

7. An amplifier circuit comprising:

a differential amplifier unit which includes one or more differential amplifier circuits;

a detector unit for detecting a peak value of an output voltage of the differential amplifier unit;

a generator unit for generating an offset compensation voltage for offset compensation based on a detection result of the detector unit; and a limiter unit for limiting the offset compensation voltage generated by the generator unit into a predetermined range and feeds back the limited offset compensation voltage to the differential amplifier unit, wherein:

the detector unit detects the peak value and an intermediate value of the output voltage of the differential amplifier unit, generates a first reference voltage by adding a predetermined external voltage to a voltage of the intermediate value, and outputs the peak value and the first reference voltage to the generator unit, and the generator unit generates the offset compensation voltage based on the peak value and the first reference voltage to the generator unit voltage fed from the generator unit.

* * * * *